United States Patent
Yonehara et al.

(10) Patent No.: US 7,622,363 B2
(45) Date of Patent: Nov. 24, 2009

(54) SEMICONDUCTOR SUBSTRATE, SEMICONDUCTOR DEVICE, LIGHT EMITTING DIODE AND PRODUCING METHOD THEREFOR

(75) Inventors: Takao Yonehara, Atsugi (JP); Yoshinobu Sekiguci, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 178 days.

(21) Appl. No.: 10/545,609

(22) PCT Filed: Apr. 30, 2004

(86) PCT No.: PCT/JP2004/006346

§ 371 (c)(1),
(2), (4) Date: Aug. 16, 2005

(87) PCT Pub. No.: WO2004/099473

PCT Pub. Date: Nov. 18, 2004

(65) Prior Publication Data

US 2006/0166468 A1    Jul. 27, 2006

(30) Foreign Application Priority Data

May 6, 2003   (JP)   ............... 2003-127999
Oct. 20, 2003   (JP)   ............... 2003-359348

(51) Int. Cl.
*H01L 21/30*   (2006.01)
*H01L 21/46*   (2006.01)

(52) U.S. Cl. ............... 438/458; 257/E21.57; 438/409; 438/455

(58) Field of Classification Search ............ 257/E21.57; 438/409, 455, 458
See application file for complete search history.

(56) References Cited

U.S. PATENT DOCUMENTS

| | | | | |
|---|---|---|---|---|
| 4,779,108 A | * | 10/1988 | Inoue | 347/238 |
| 5,331,333 A | * | 7/1994 | Tagawa et al. | 345/7 |
| 5,371,037 A | | 12/1994 | Yonehara | 437/86 |
| 5,439,843 A | | 8/1995 | Sakaguchi et al. | 437/71 |
| 5,528,057 A | * | 6/1996 | Yanagase et al. | 257/96 |
| 5,712,199 A | | 1/1998 | Nakagawa et al. | 438/62 |
| 5,750,000 A | | 5/1998 | Yonehara et al. | 156/630.1 |
| 5,755,914 A | | 5/1998 | Yonehara | 156/281 |
| 5,763,288 A | | 6/1998 | Sakaguchi et al. | 438/455 |
| 5,811,348 A | | 9/1998 | Matsushita et al. | 438/455 |
| 5,840,616 A | | 11/1998 | Sakaguchi et al. | 438/459 |

(Continued)

FOREIGN PATENT DOCUMENTS

EP   0 767 486   4/1997

(Continued)

OTHER PUBLICATIONS

Search Report dated Mar. 25, 2009 in European Application No. 04730716.0.

*Primary Examiner*—Asok K Sarkar
(74) *Attorney, Agent, or Firm*—Fitzpatrick, Cella, Harper & Scinto (57) ABSTRACT

A semiconductor substrate including a gallium arsenide layer is obtained by executing a step of preparing a first substrate having a separating layer constituted of germanium and a gallium arsenide layer on the separating layer, a step of preparing a bonded substrate by bonding the first substrate and a second substrate, and a step of dividing the bonded substrate at a portion of the separating layer.

25 Claims, 8 Drawing Sheets

U.S. PATENT DOCUMENTS

| | | | |
|---|---|---|---|
| 5,854,123 A | 12/1998 | Sato et al. | 438/507 |
| 5,856,229 A | 1/1999 | Sakaguchi et al. | 438/406 |
| 5,868,947 A | 2/1999 | Sakaguchi et al. | 216/2 |
| 5,970,361 A | 10/1999 | Kumomi et al. | 438/409 |
| 6,106,613 A | 8/2000 | Sato et al. | 117/54 |
| 6,140,209 A | 10/2000 | Iwane et al. | 438/458 |
| 6,143,628 A | 11/2000 | Sato et al. | 438/455 |
| 6,150,031 A | 11/2000 | Yonehara | 428/446 |
| 6,156,624 A | 12/2000 | Yamagata et al. | 438/459 |
| 6,190,937 B1 | 2/2001 | Nakagawa et al. | 438/67 |
| 6,211,038 B1 | 4/2001 | Nakagawa et al. | 438/409 |
| 6,258,698 B1 | 7/2001 | Iwasaki et al. | 438/455 |
| 6,306,729 B1 | 10/2001 | Sakaguchi et al. | 438/458 |
| 6,326,279 B1 | 12/2001 | Kakizaki et al. | 438/406 |
| 6,331,208 B1 | 12/2001 | Nishida et al. | 117/89 |
| 6,382,292 B1 | 5/2002 | Ohmi et al. | 156/584 |
| 6,391,743 B1 | 5/2002 | Iwane et al. | 438/458 |
| 6,426,274 B1 * | 7/2002 | Tayanaka | 438/458 |
| 6,429,095 B1 | 8/2002 | Sakaguchi et al. | 438/458 |
| 6,452,091 B1 | 9/2002 | Nakagawa et al. | 136/261 |
| 6,475,323 B1 | 11/2002 | Ohmi et al. | 156/239 |
| 6,503,778 B1 * | 1/2003 | Yamauchi et al. | 438/107 |
| 6,566,235 B2 | 5/2003 | Nishida et al. | 438/458 |
| 6,613,678 B1 | 9/2003 | Sakaguchi et al. | 438/695 |
| 6,639,327 B2 | 10/2003 | Momoi et al. | 257/913 |
| 6,677,183 B2 | 1/2004 | Sakaguchi et al. | 438/113 |
| 6,746,559 B2 | 6/2004 | Ohmi et al. | 156/239 |
| 6,756,289 B1 | 6/2004 | Nakagawa et al. | 438/478 |
| 6,891,578 B2 | 5/2005 | Yonehara et al. | 349/43 |
| 6,972,215 B2 | 12/2005 | Sakaguchi et al. | 438/113 |
| 7,015,507 B2 | 3/2006 | Yonehara et al. | 257/65 |
| 7,029,950 B2 | 4/2006 | Yonehara et al. | 438/113 |
| 2003/0190794 A1 | 10/2003 | Ohmi et al. | 438/458 |
| 2005/0124137 A1 | 6/2005 | Yonehara | 438/455 |
| 2005/0148122 A1 | 7/2005 | Yonehara | 438/149 |
| 2006/0019466 A1 | 1/2006 | Nayfeh et al. | 438/458 |

FOREIGN PATENT DOCUMENTS

| | | |
|---|---|---|
| EP | 0 797 258 | 9/1997 |
| EP | 0 867 919 | 9/1998 |
| EP | 1 050 901 | 11/2000 |
| JP | 4-10536 | 1/1992 |
| JP | 7-302889 | 11/1995 |
| JP | 10-135500 | 5/1998 |
| JP | 10-326884 | 12/1998 |
| JP | 2877800 | 1/1999 |
| JP | 11-168236 | 6/1999 |
| JP | 2000-349267 | 12/2000 |
| JP | 3157030 | 2/2001 |
| JP | 3237889 | 10/2001 |
| JP | 3237890 | 10/2001 |
| JP | 2001-339100 A | 12/2001 |
| JP | 2002-270515 A | 9/2002 |

* cited by examiner

SEMICONDUCTOR SUBSTRATE, SEMICONDUCTOR DEVICE, LIGHT EMITTING DIODE AND PRODUCING METHOD THEREFOR

TECHNICAL FILED

The present invention relates to a semiconductor substrate, a semiconductor device and a light emitting device having a gallium arsenide layer and a producing method therefor.

BACKGROUND ART

A semiconductor device on a compound semiconductor substrate such as of gallium arsenide shows a high performance such as excellent high speed and light emitting property, which are not obtainable on silicon. However, the compound semiconductor substrate is associated with drawbacks of expensiveness, a low mechanical strength, difficulty in preparing a large-sized substrate etc.

Because of these facts, it has been tried to heteroepitaxially growing a compound semiconductor on a silicon substrate which can be obtained inexpensively, with a high mechanical strength and in a large-sized substrate. For example, Japanese Patents Nos. 3157030, 3237889 and 3237890 disclose a method of heteroepitaxially growing a compound semiconductor layer on a porous silicon layer formed on a silicon substrate, then bonding the silicon substrate with another substrate, and eliminating portions of the silicon substrate and of the porous silicon layer with an etching liquid to obtain a compound semiconductor substrate of a large area. Also Japanese Patent No. 2877800 discloses a method of growing a compound semiconductor layer on a porous silicon layer formed on a silicon substrate, then bonding the silicon substrate with another substrate, and breaking the porous silicon layer and dividing the bonded substrate by a fluid jet flow to obtain a compound semiconductor substrate.

Figure 24:
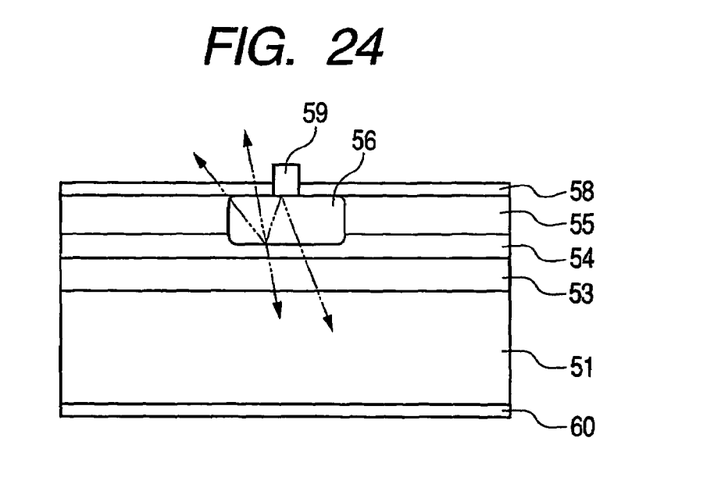
FIG. 24 is a view showing a structure of a prior light emitting diode.

As an example of a semiconductor device formed for example with gallium arsenide, a configuration of a light emitting diode chip is shown in FIG. 24. The configuration shown in FIG. 24 is basically constituted by laminating, on an n-GaAs substrate 51, an n-$Al_xGa_{1-x}As$ carrier confinement layer 53, an n-$Al_yGa_{1-y}As$ light emitting layer 54, and an n-$Al_xGa_{1-x}As$ carrier confinement layer 55. There are also provided a p-diffusion area 56 formed by locally diffusing Zn, an insulation layer 58, a metal electrode 59 formed in the p-diffusion area, and an n-side metal electrode 60 formed on the rear side of the GaAs substrate 51. In response to a current supply between the electrodes 59 and 60, a light emission is induced in the vicinity of a p-n junction interface close to a Zn diffusion front, but, as the light emission is omnidirectional, a part only of the light directed toward an exit window provided on the upper surface of the light emitting diode is emitted to the exterior.

In the configuration shown in FIG. 24, since the GaAs substrate 51 is absorbent to the emitted light, about 85% of the generated light is absorbed by the GaAs substrate 51. Also as the p-side metal electrode 59 formed on the p-diffusion area 56 constitutes a shield when the light generated in the light emitting layer is emitted to the exterior, the amount of light radiation is further decreased.

For example Japanese Patent Application Laid-open No. 11-168236 discloses a configuration of a light emitting diode capable of avoiding light absorption by a substrate, by adhering a semiconductor laminated portion constituted of a compound semiconductor to an alternative substrate different from a substrate used for crystal growth, then eliminating the substrate from the semiconductor laminated portion and providing a light reflecting layer such as a metal film between the semiconductor laminated portion and the alternative substrate.

In the producing method disclosed for example in Japanese Patent No. 3157030, a heteroepitaxial layer is formed by inserting a porous silicon layer is made present between the silicon and the compound semiconductor, thereby relaxing an mismatching of the lattice constants of silicon and compound semiconductor to a certain extent. However the crystallinity of the obtained compound semiconductor may still be insufficient, because it is not easy to eliminate the mismatching in the lattice constants of the porous silicon and the compound semiconductor. Also, depending on the specification of the desired compound semiconductor device, the compound semiconductor substrate obtained by such producing method is limited in its applicable range, and may not be able to fully exploit the advantage of the compound semiconductor device.

Also in the producing method for the light emitting diode disclosed in Japanese Patent Application Laid-open No. 11-168236, a substrate of a thickness of 300 to 500 μm is eliminated by grinding or the like from the semiconductor laminated portion of a thickness of several micrometers. In such elimination by grinding, it is difficult to uniformly control the film thickness of the semiconductor laminated portion, and it may become impossible to fully exploit the advantage of the compound semiconductor device.

DISCLOSURE OF THE INVENTION

The present invention has been made on the aforementioned situation, and an object of the present invention is to provide a producing method for a semiconductor substrate, a semiconductor device and a light emitting device, capable of sufficiently exploiting the advantage of a compound semiconductor device and still securing economical property.

Another object of the present invention is to provide a producing method for a light emitting device, capable of fully exploiting the advantage of a compound semiconductor device, enabling an easy manufacture, absent from a light absorption by a semiconductor substrate, and having a high light emitting efficiency.

A producing method for a semiconductor substrate of the present invention is characterized in including a step of preparing a first substrate having a separating layer of germanium and a gallium arsenide layer on the separating layer, a step of preparing a bonded substrate by bonding the first substrate and a second substrate, and a step of separating the bonded substrate in a portion of the separating layer.

Also in the present invention, a producing method for a light emitting diode is characterized in including a step of forming a porous germanium layer on a semiconductor substrate constituted of germanium, a step of forming plural semiconductor layers including a gallium arsenide layer on the porous germanium layer, a step of forming a light emitting diode area in the semiconductor layers, a step of forming a reflective layer on the light emitting diode area, and a step of separating the semiconductor substrate at the porous germanium layer.

Also in the present invention, a producing method for a light emitting diode is characterized in including a step of forming a porous germanium layer on a semiconductor substrate constituted of germanium, a step of forming plural semiconductor layers including a gallium arsenide layer on the porous germanium layer, a step of forming a metal electrode layer on the plural semiconductor layers, a step of adhering a support substrate to the surface of the metal layer, a step of separating the semiconductor substrate at the porous germanium layer, and a step of forming a light emitting diode in the semiconductor layer after the separation.

Other advantages and features of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the description, illustrate embodiments of the invention and, together with the description, serve to explain the principles of the invention.

BEST MODE FOR CARRYING OUT THE INVENTION

Now preferred embodiments of the present invention will be explained in detail with reference to the accompanying drawings.

FIGS. 1 to 7 are views for explaining a producing method for a semiconductor substrate, in a preferred embodiment of the present invention. A step shown in FIG. 1 prepares a germanium substrate 11. Then a step shown in FIG. 2 forms a separating layer 12 on the surface of the germanium substrate 11. The separating layer 12 is preferably a porous germanium layer formed by anodizing the surface of the germanium substrate 11. The anodizing can be executed, for example, by positioning an anode and a cathode in an electrolyte solution containing hydrofluoric acid (HF), positioning the germanium substrate between these electrodes and causing an electric current between these electrodes. The porous germanium layer may also be constituted of two or more plural layers with mutually different porosity.

Figure 3:
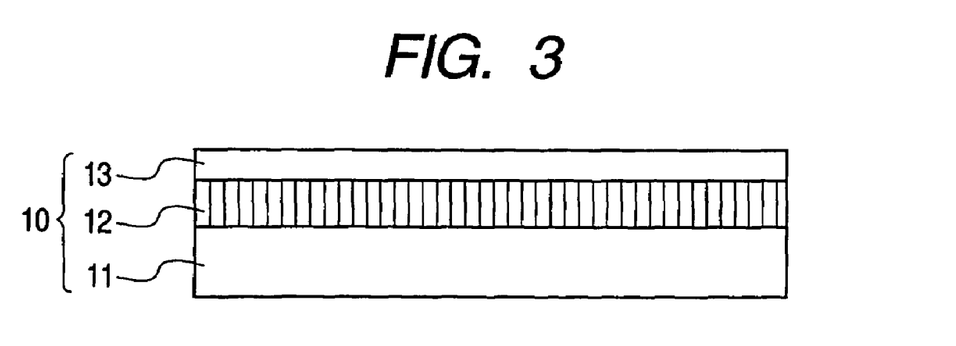
FIG. 3 is a view showing a producing method for a semiconductor substrate in a preferred embodiment of the present invention.

A step shown in FIG. 3 forms a gallium arsenide layer 13 by an epitaxial growth on the porous germanium layer constituting the separating layer 12, thereby obtaining a first substrate 10. Mismatching in the lattice constants between germanium and gallium arsenide is small, and the porous germanium layer 12 present between the germanium and the gallium arsenide further relaxes such small mismatching in the lattice constants, so that a gallium arsenide layer 13 of a satisfactory crystallinity can be form on the germanium substrate 11. Also the epitaxial growth allows to form a gallium arsenide layer with a uniform thickness.

Figure 4:
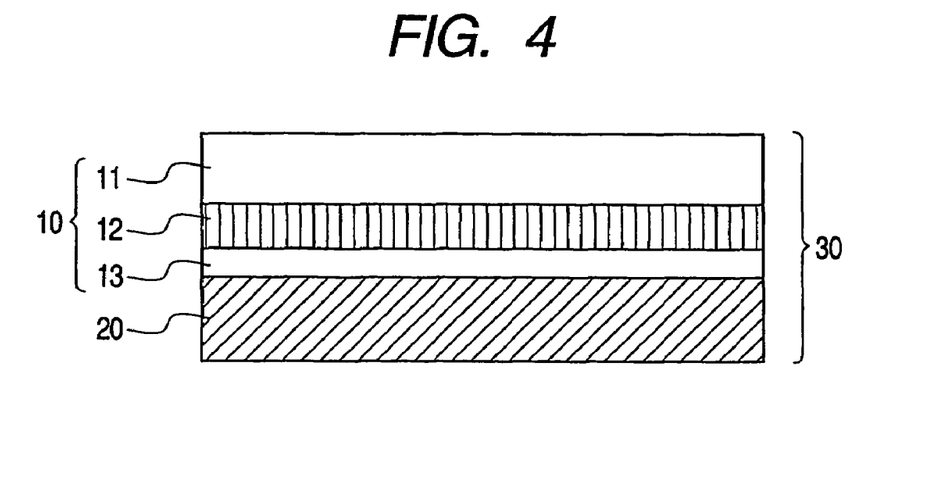
FIG. 4 is a view showing a producing method for a semiconductor substrate in a preferred embodiment of the present invention.

A step shown in FIG. 4 bonds a second substrate 20 to the surface of the first substrate 10 shown in FIG. 3, thereby forming a bonded substrate 30. As the second substrate 20, there can be typically employed a silicon substrate or a substrate bearing an insulation layer such as of $SiO_2$ on the surface thereof. The second substrate 20 may also be another substrate, for example an insulating substrate such as a glass substrate.

Figure 5:
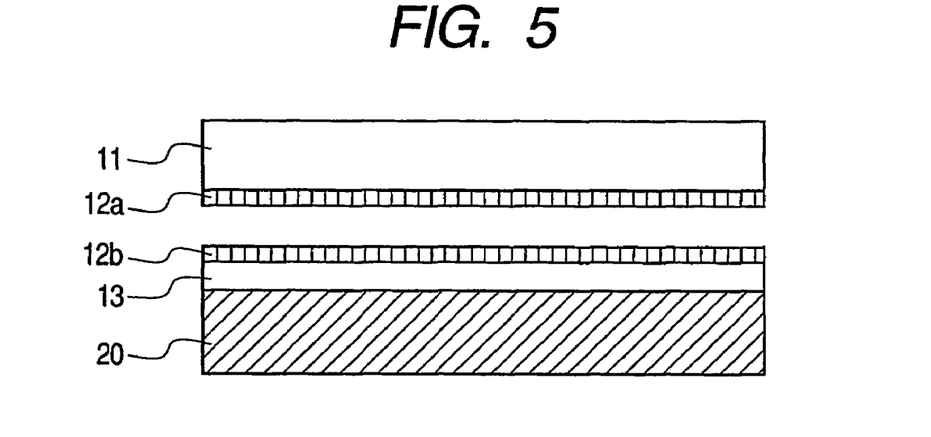
FIG. 5 is a view showing a producing method for a semiconductor substrate in a preferred embodiment of the present invention.

A step shown in FIG. 5 breaks the bonded substrate 30 at a portion of the separating layer 12 thereby dividing it into two substrates. Such division can be executed for example utilizing a fluid. As a method utilizing a fluid, there can be advantageously utilized, for example, a method of forming a jet of a fluid (liquid or gas) and injecting it into the separating layer 12, or a method utilizing a static pressure of a liquid. In the former, a method utilizing water as the fluid is called a water jet method. The aforementioned division can also be achieved by applying a heat treatment to the bonded substrate 30. The aforementioned division can further be achieved by inserting a solid member such as a wedge into the separating layer 12.

Figure 6:
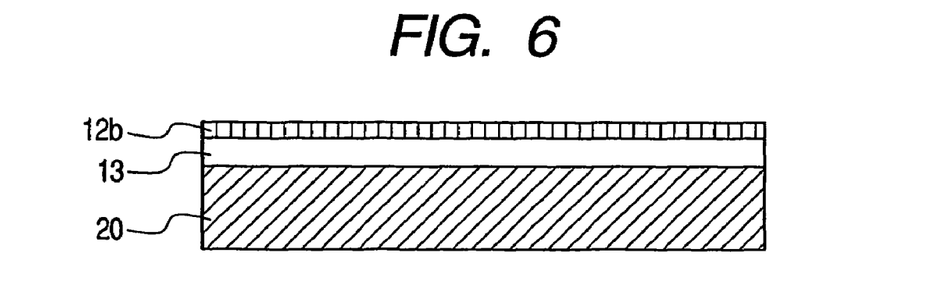
FIG. 6 is a view showing a producing method for a semiconductor substrate in a preferred embodiment of the present invention.

A step shown in FIG. 6 eliminates a separating layer 12b, remaining on the gallium arsenide layer 13 of the second substrate 20, with an etching liquid of the like. In this operation, the gallium arsenide layer 13 may be utilized as an etching stop layer. Thereafter, a planarization may be executed, if necessary, by a planarizing step such as a hydrogen annealing step or a polishing step.

Figure 7:
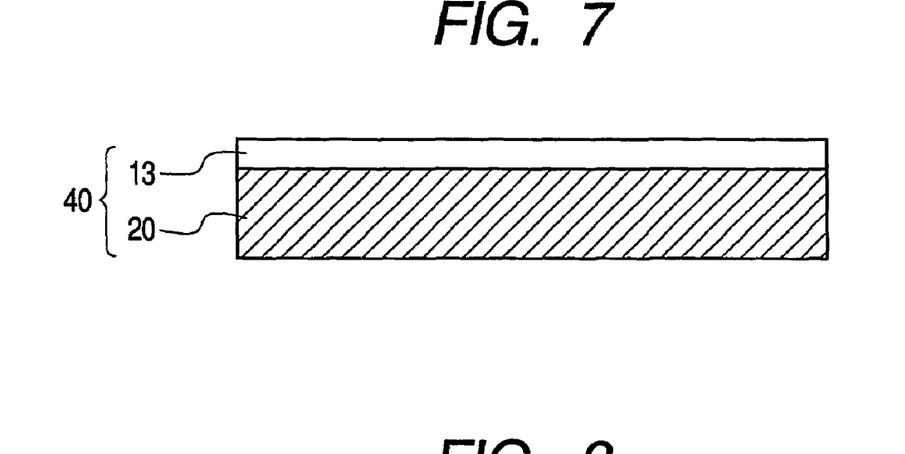
FIG. 7 is a view showing a producing method for a semiconductor substrate in a preferred embodiment of the present invention.

Through the aforementioned process, there is obtained a semiconductor substrate 40 as shown in FIG. 7. The semiconductor substrate 40 shown in FIG. 7 has, at the surface, a thin gallium arsenide layer 13. The thin gallium arsenide layer means that it is thinner than an ordinary semiconductor substrate, and the thin gallium arsenide layer 13 preferably has a thickness for example within a range of 5 nm to 5 µm in order to exhibit the superiority of the semiconductor device. Also depending upon the specifications of the semiconductor device, another compound semiconductor layer such as of AlGaAs, GaP, InP or InAs may be formed on the gallium arsenide (GaAs) layer 13.

Also after the division in the step shown in FIG. 5, a separating layer 12a, remaining on the germanium substrate 11, is eliminated with an etching liquid of the like. The germanium substrate may be surface planarized for example by a hydrogen annealing step or a polishing step, and may be re-used as the germanium substrate 11 in the step shown in FIG. 1. Such repeated use of the germanium substrate 11 allows to significantly reduce the production cost of the semiconductor substrate.

As explained above, the producing method of the present invention allows to obtain a semiconductor substrate having a gallium arsenide layer of a uniform film thickness and a satisfactory crystallinity. Also the producing method of the present invention allows to greatly reduce the production cost of the semiconductor substrate having a gallium arsenide layer.

FIGS. 10 to 17 are views for explaining a producing method for a light emitting diode, relating to a preferred embodiment of the present invention.

Figure 10:
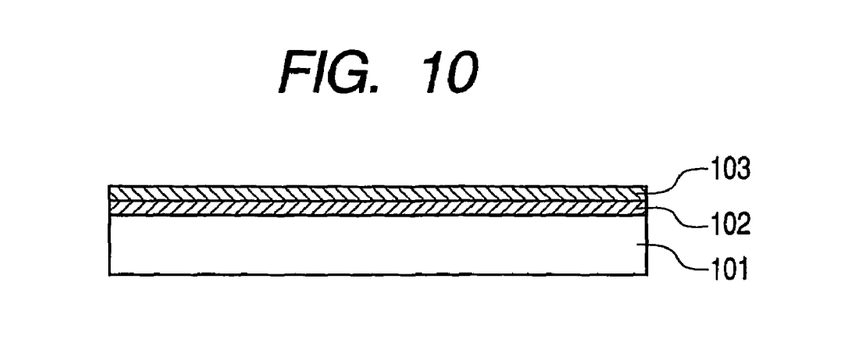
FIG. 10 is a view showing a producing method for a light emitting diode in a preferred embodiment of the present invention.

At first, as shown in FIG. 10, a porous germanium layer is formed by anodizing on a germanium substrate 101. The porous germanium layer is with a two-layered configuration, and a porous germanium layer 103 of a lower porosity is formed at first and then a porous germanium layer 102 of a higher porosity is formed. In this manner, a next step of closing pores present on the surface prior to epitaxial growth is facilitated, and a stress is concentrated at the interface of the two porous germanium layers to enable a smooth separation of the germanium substrate 101.

Figure 11:
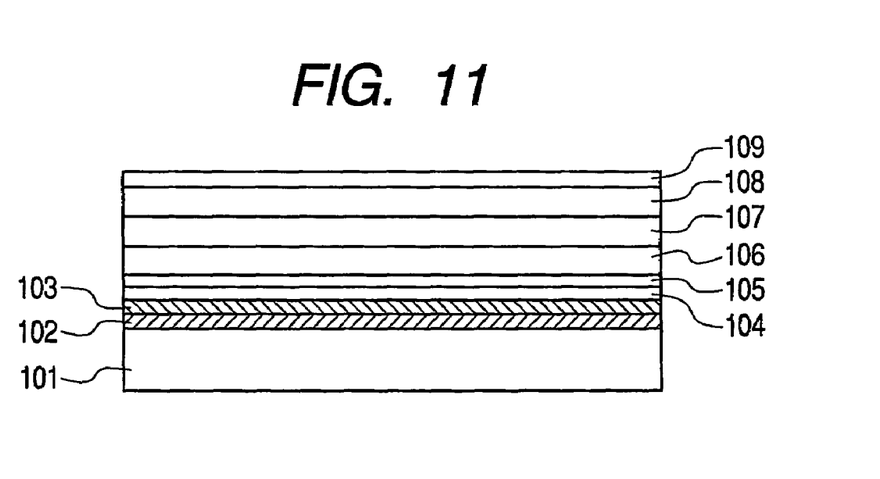
FIG. 11 is a view showing a producing method for a light emitting diode in a preferred embodiment of the present invention.

Then a high-temperature hydrogen annealing and a CVD process utilizing $GeH_4$, $GeCl_4$ etc. as the raw material gas close the pores present on the surface of the porous germanium layer to form a satisfactory crystalline surface on the surface of the porous germanium constituting a substrate, and a single crystal germanium layer 104, an n-GaAs layer 105, an n-$Al_xGa_{1-x}As$ layer 106, an n-$Al_yGa_{1-y}As$ layer 107, an n-$Al_xGa_{1-x}As$ layer 108, and an n-GaAs layer 109 (y<x) are epitaxially grown in succession, as shown in FIG. 11.

The growth of the GaAs layer on the germanium layer becomes a heteroepitaxial growth, but a GaAs layer and an AlGaAs layer can be obtained with an extremely low defect level since the lattice constant 5.64613 A of germanium crystal is very close to the lattice constant 5.6533 A of GaAs crystal. An impurity concentration and a thickness of the epitaxially grown layer depend on the designing of the device, but the impurity concentration is about $10E17/cm^3$ and the thickness if about 2 to 3 µm.

Figure 12:
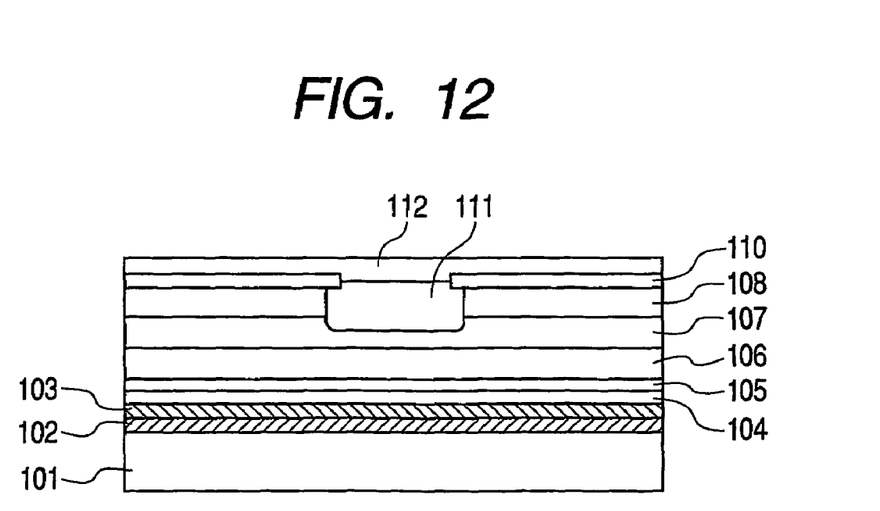
FIG. 12 is a view showing a producing method for a light emitting diode in a preferred embodiment of the present invention.

Then, as shown in FIG. 12, a light emitting diode is formed by a semiconductor process in such epitaxial layers. In the outline of the semiconductor process, Zn is selectively heat diffused to convert a part of the n-$Al_yGa_{1-y}As$ layer 107, the n-$Al_xGa_{1-x}As$ layer 108, and the n-GaAs layer 109 into a p-area 111. The n-GaAs layer 1099 is eliminated excluding the area converted into p-type, then a SiN insulation layer 110 is formed and a metal electrode 112 is formed.

The metal electrode 112 is a reflective mirror serving partly as an electrode, and reflects, among light generated in a pn junction formed by Zn thermal diffusion in the n-$Al_yGa_{1-y}As$ layer 107, a light directed toward the metal electrode 112 and causes such light to be emitted from a light emitting window formed at the opposite surface. It is thus made possible to cause the light, proceeding in a direction opposite to the light emitting side, to be emitted to the exterior, thereby significantly improving the light emitting efficiency.

Figure 13:
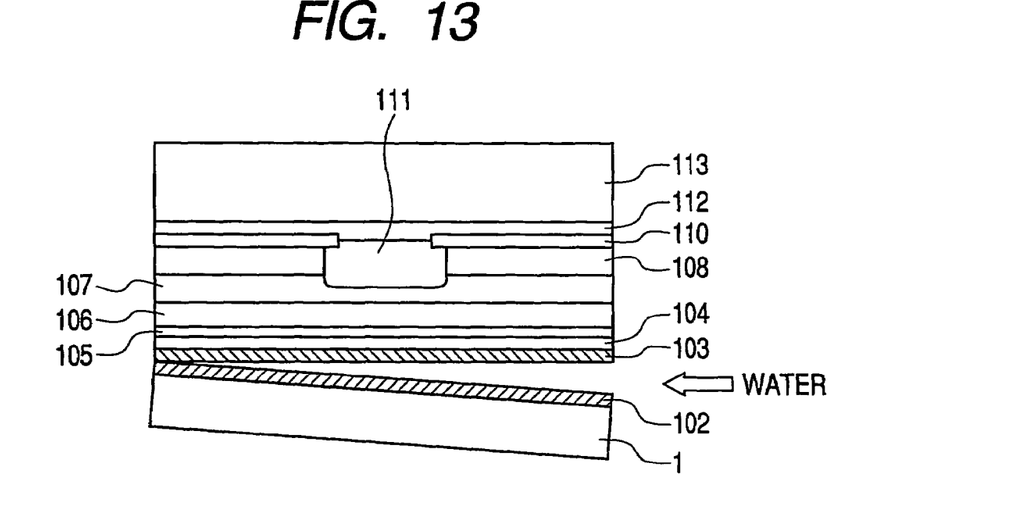
FIG. 13 is a view showing a producing method for a light emitting diode in a preferred embodiment of the present invention.

Then, as shown in FIG. 13, a handle substrate 113 is adhered with a peelable adhesive tape (not shown) to the surface of the metal electrode 112, and a high pressure water flow W (water jet), focused into a fine flow, is ejected to the vicinity of the porous layers 102 and 103. Since a large stress is present at the interface of the porous layers 102 and 103, under the ejection of the high pressure water flow, the substrate can be easily separated at the interface of the two porous germanium layers 102 and 103. Such substrate separating method is excellent in reliability.

Figure 14:
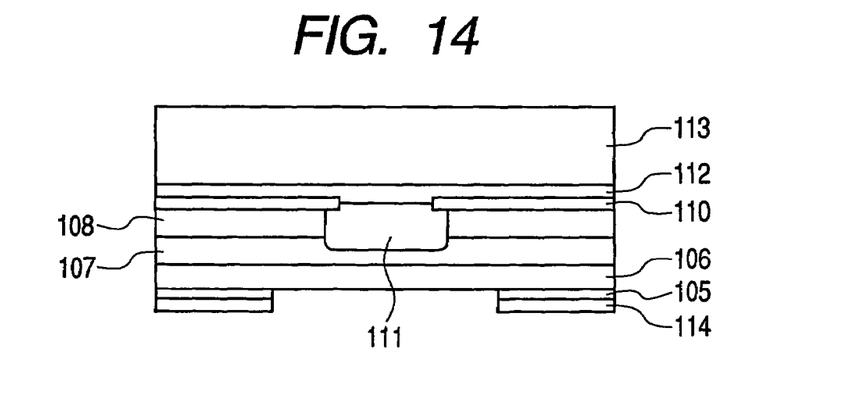
FIG. 14 is a view showing a structure of a light emitting diode in a preferred embodiment of the present invention.

The porous germanium layer 103 remaining on the surface after the separation of the germanium substrate 101 is eliminated by etching, and an etching stop can be reproducibly realized at the interface of the porous layer and the epitaxial layer, because the porous layer has a low density and shows a very high etching rate. Thereafter the germanium layer 104 and, if necessary, the GaAs epitaxial layer 105 are partially eliminated by etching as shown in FIG. 14, and an n-side metal electrode 114 is formed excluding a portion of a light emitting window.

Figure 17:
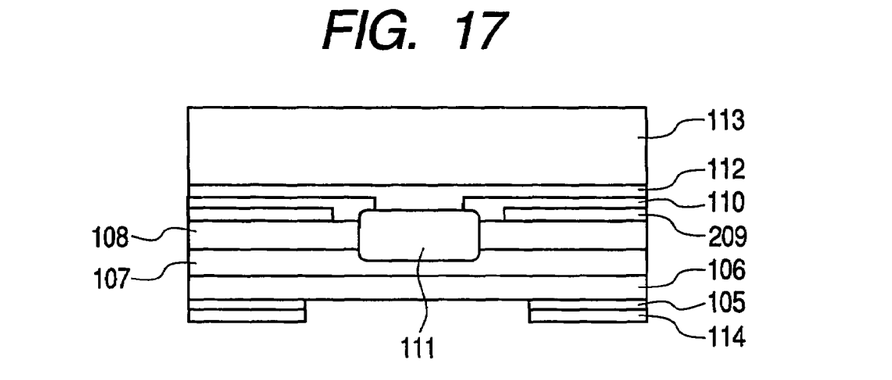
FIG. 17 is a view showing a structure of a light emitting diode in a preferred embodiment of the present invention.

In this process, the germanium substrate 101 is separated after the formation of the light emitting diode area, but it is also possible to separate the germanium substrate 101 at first and then to form the light emitting diode area. It is also very effective, as shown in FIG. 17, to provide a light absorbing layer 209 in the vicinity of the p-side metal electrode 12 in order to absorb the light not emitted to the exterior of the light emitting diode. The light absorbing layer 209 may also be formed by partially leaving the n-GaAs layer 109, and is effective in eliminating a stray light, controlling a light leakage from an area other than the light emitting area, and obtaining a light excellent in convergence.

Figure 15:
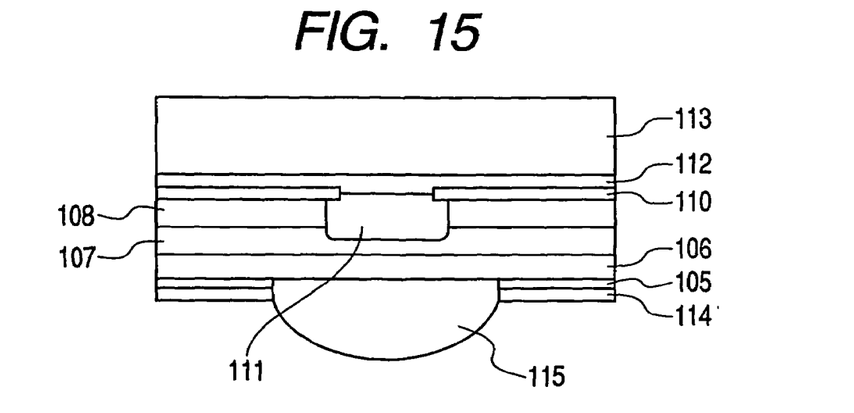
FIG. 15 is a view showing a structure of a light emitting diode in a preferred embodiment of the present invention.

In case of improving the directionality of the emitted light, a mold lens 115 is formed on the light emitting window as shown in FIG. 15, and such lens can be obtained with uniform characteristics since the mold lens 115 is formed on a flat plane.

Then there is executed a separation into a light emitting diode chip or a light emitting diode array. A dicing saw may be used for such separation, but a chip separation with a laser or by a creeping is also possible since the configuration is thin. Such method not only reduces an area for chip separation but also enables a highly precise chip separation, thus significantly improving the aligning precision in an application requiring an array of chips.

Figure 16:
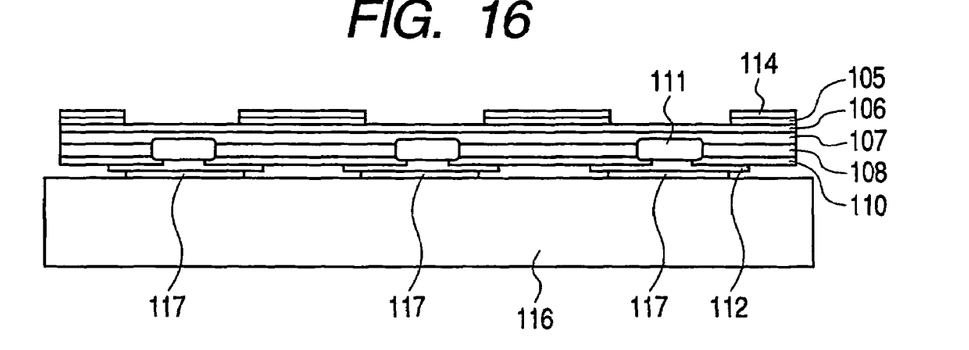
FIG. 16 is a view showing a structure of a light emitting diode in a preferred embodiment of the present invention.

Finally, the light emitting diode chip or the light emitting diode array is peeled off from the handle substrate 113. Thereafter, the light emitting diode chip or the light emitting diode array is die bonded to a desired mounting support. FIG. 16 is a cross-sectional view in case of a light emitting diode array chip in a state after separation of the handle substrate 113.

In case of a light emitting diode array chip with a narrow pitch, it may be directly bonded to lead wirings 117 of a driver IC 16 or a relay wiring pattern board (not shown) as shown in FIG. 16 to achieve a narrow-pitch wiring difficult by wire bonding. Since the electrical connection by direct bonding is executed by cleaning the metal surface for example by argon sputtering and by a direct contact under a pressure, it enables a wiring connection of a fine pitch without requiring a pad size as in the wire bonding. Also this configuration shows a satisfactory heat radiation and an excellent stability in temperature, since the light emitting part is positioned close to a heat sink or a heat dissipating substrate.

Also the separated germanium substrate 101, after elimination of the porous germanium layer 102 remaining on the surface, can be restored to the initial surface state for example by polishing, and a repeated use of the germanium substrate 101 significantly reduces a proportion of the substrate cost in the production cost.

Also since the germanium substrate has a higher hardness than in GaAs substrate and can be produced in a large size, a reduction in the production cost is also possible by the use of a substrate larger than the GaAs substrate. In the present embodiment, the germanium substrate 101 is separated after the light emitting diode process, but it is also possible to execute the light emitting diode process after the germanium substrate 101 is separated.

In the present invention, after the formation of a porous layer on a germanium substrate, the surface is planarized and plural GaAs layers including a light emitting layer are laminated. Thereafter a light emitting diode is formed, and the semiconductor substrate is separated at the position of the porous layer. In this manner, it becomes unnecessary to eliminate the substrate of a thickness of several hundred micrometers by polishing or etching, and, since the porous germanium layer remaining on the side of the laminated semiconductor layers is as thin as several micrometers and has an etching rate which is larger by several digits than that of crystalline germanium, the porous layer alone can be selectively and reproducibly eliminated by etching.

Then, in a step of forming a light emitting window, an electrode and a light emitting diode on the plane after the elimination of the porous layer, a reflective mirror partially serving as an electrode is formed on the surface, whereby the light emitting toward a plane opposite to the side of the light emitting window can also be reflected and emitted to the exterior. Therefore, there can be easily realized a configuration of a light emitting diode capable of avoiding the absorption by the semiconductor substrate, whereby the light emitting efficiency can be significantly improved. Also an absorbing member for absorbing the light of the light emitting diode, not emitted to the exterior, is appropriately provided to reduce a stray light or a light bleeding, thereby realizing a light emitting diode of a satisfactory controllability.

According to the present invention, formation of the planar light-emitting diode on the surface of the semiconductor substrate across the porous layer and separation of the substrate from the part of the porous layer allow to dispense with an etch stop technology of stopping the etching at the interface of the substrate or a selective etching technology utilizing an etching rate lower by several digits in the laminated semiconductor layers, so that the manufacture can be easily executed. Also there can be easily realized a configuration in which the light emitted toward the side opposite to the light emitting window is also reflected, and a significant improvement in the light emitting efficiency can be realized by a light emitting diode configuration capable of avoiding the absorption by the semiconductor substrate.

EXAMPLES

In the following, examples of the present invention will be explained.

Example 1

At first, a P-type Ge substrate 11 of a specific resistivity of 0.01 Ω·cm was prepared. Then the Ge substrate 11 was anodized in an anodizing solution to form a porous Ge layer as a separating layer 12. The anodizing conditions were as follows:

current density: 6 ($mA/cm^2$)
anodizing solution: $HF:H_2O:C_2H_5OH=1:1:1$
period: 11 (minutes)
thickness of porous Ge: 12 (μm).

The current density and the concentration of the anodizing solution can be suitably varied according to the thickness and the structure of the separating layer (porous Ge layer) 12 to be formed. The current density is preferably within a range of 0.5 to 700 $mA/cm^2$, and the concentration of the anodizing solution is preferably within a range of 1:10:10 to 1:0:0.

The porous Ge layer is effective as a relaxing layer for forming an epitaxial GaAs layer of a high quality thereon and as a separating layer.

The anodizing solution can be a solution containing HF, and may be free from ethanol. However, ethanol, being effective for eliminating bubbles generated from the substrate surface, is preferably added to the anodizing solution. A chemical having such bubble eliminating function can be, in addition to ethanol, for example another alcohol such as methyl alcohol or isopropyl alcohol, or a surfactant. Instead of the addition of such chemical, it is also effective to release the bubbles from the substrate surface by a vibration for example an ultrasonic vibration.

Then, on the porous Ge layer, a GaAs layer 13 of a thickness of 0.3 μm was epitaxially grown by MOCVD (metal organic chemical vapor deposition) process to obtain a first substrate 10. The growing conditions were as follows:

source gas: $Ga(CH_3)_3/AsH_3$
temperature: 600° C.
growth rate: 0.05 μm/min.

These growing conditions may be suitably varied according to the specifications of the required GaAs layer 13.

Then a surface of a separately prepared second substrate 20 was superposed and contacted with the surface of the first substrate 10, and a heat treatment was conducted for 5 minutes at 800° C. to increase the bonding strength of the first substrate 10 and the second substrate 20. Thus a bonded substrate 30 was obtained.

Then, toward a gap in the periphery of the bonded substrate 30 (formed by beveled portions of the two substrates 10, 20), high-pressure purified water of a pressure of 50 MPa was ejected from a nozzle of a diameter of 0.1 mm of a water jet apparatus in a direction parallel to the bonding interface of the bonded substrate 30 to break the bonded substrate 30 at a position of the separating layer 12, thereby dividing the bonded substrate 30 into two substrates. In this operation, the pressure of the purified water is preferably from several to 100 MPa.

In such dividing step, it is possible (1) to move the nozzle in a scanning motion in such a manner that the jet stream formed by the purified water ejected from the nozzle moves along the gap formed by the beveled portions, or (2) to hold and rotate the bonded substrate by pinching with a wafer holder in such a manner that the purified water is injected into the gap formed by the beveled portions over the entire periphery of the bonded substrate, or (3) to combine the methods (1) and (2).

As a result, the epitaxial GaAs layer 13 and a part 12a of the porous Ge layer 12, originally formed on the first substrate 10, were transferred onto the second substrate 20. A porous Ge layer 12a alone remained on the surface of the Ge substrate 11.

Instead of dividing (separating) the bonded substrate by the water jet method, it is also possible to utilize a gas jet, to insert a solid wedge into the separating layer of the bonded substrate, to apply a mechanical force such as a tensile force or a shearing force to the bonded substrate, to apply an ultrasonic wave to the bonded substrate, or to employ other methods.

Then the porous Ge layer 12b transferred onto the outermost surface of the second substrate 20 was selectively etched off by an etching solution containing a mixture at least of 49% hydrofluoric acid (HF), 30% hydrogen peroxide ($H_2O_2$) and water ($H_2O$). The GaAs layer 13 remained without being etched while the porous Ge layer 12b was removed by selective etching. In the selective etching, an uneven distribution of etching within the substrate plane and between the substrates can be suppressed by an etching operation with an etching apparatus provided with a circulator for circulating the etching solution, under an intermittent application of an ultrasonic wave and a rotation of the substrate. Also an addition of an alcohol or a surface to the etching solution allows to suppress an uneven etching, resulting from surface sticking of bubbles generated in the reaction.

Through the aforementioned process, there was obtained a semiconductor substrate, having a GaAs layer 13 of a thickness of 0.3 µm on the surface. Also no change was caused in the GaAs layer 13 by the selective etching of the porous Ge layer. The thickness of thus formed GaAs layer 13, measured at 100 points over the entire surface, showed an evenness of 301±4 nm.

A cross-sectional observation by a transmission electron microscope confirmed that the GaAs layer retained satisfactory crystallinity.

A heat treatment in hydrogen was further conducted for 1 hour at 600° C., and the surface roughness of the GaAs layer 13 was evaluated by an atomic force microscope. An averaged square roughness in a square area of 50 µm was about 0.2 nm, comparable to that in a commercially available ordinary Si wafer. The surface planarization may be conducted, instead of hydrogen annealing, by a polishing operation such as CMP.

As a pre-process for the bonding step, a plasma treatment on at least either of the surfaces of the first and second substrates to be bonded can increase the bonding strength even in case of a low-temperature annealing. After the plasma treatment, the treated substrate is preferably rinsed with water.

In the dividing step, it is also possible to divide plural bonded substrates in succession, by arranging the plural bonded substrates along the surface direction thereof and moving the nozzle of the water jet apparatus in a scanning motion along such direction.

It is furthermore possible to arrange plural bonded substrates in a direction perpendicular to the surface direction thereof, and to cause the nozzle of the water jet apparatus in an X-Y scanning motion to eject the water jet in succession to the plural bonded substrates, thereby automatically dividing the plural bonded substrates.

After the dividing step, the Ge substrate 11 may be subjected to the elimination of the porous Ge layer 12a remaining thereon, then subjected to a planarization process and used again the preparation of the first substrate, thereby lowering the production cost of the semiconductor substrate. A repetition of such re-use can drastically reduce the production cost of the semiconductor substrate.

Example 2

Figure 1:
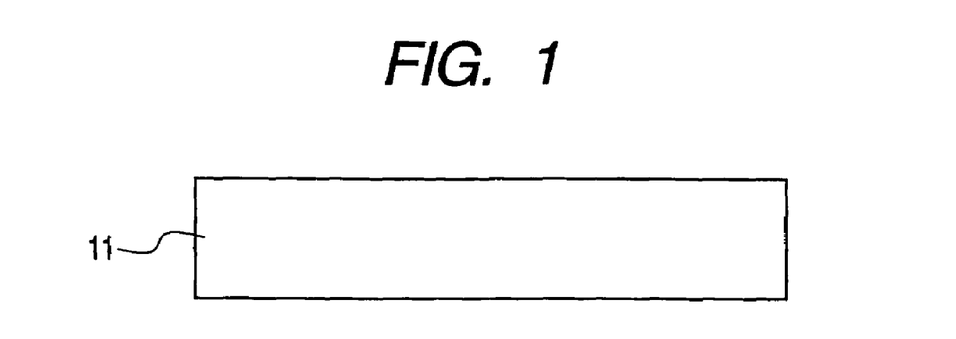
FIG. 1 is a view showing a producing method for a semiconductor substrate in a preferred embodiment of the present invention.
Figure 2:
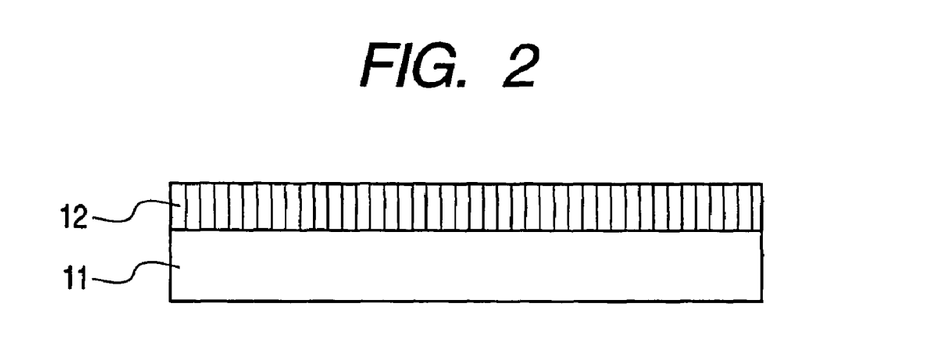
FIG. 2 is a view showing a producing method for a semiconductor substrate in a preferred embodiment of the present invention.

This example is a development of the example 1 and provides a method for producing a semiconductor device. At first, a porous Ge layer 22 is formed on a Ge substrate 21, in the same manner as shown in FIGS. 1 and 2 in the example 1.

Figure 8:
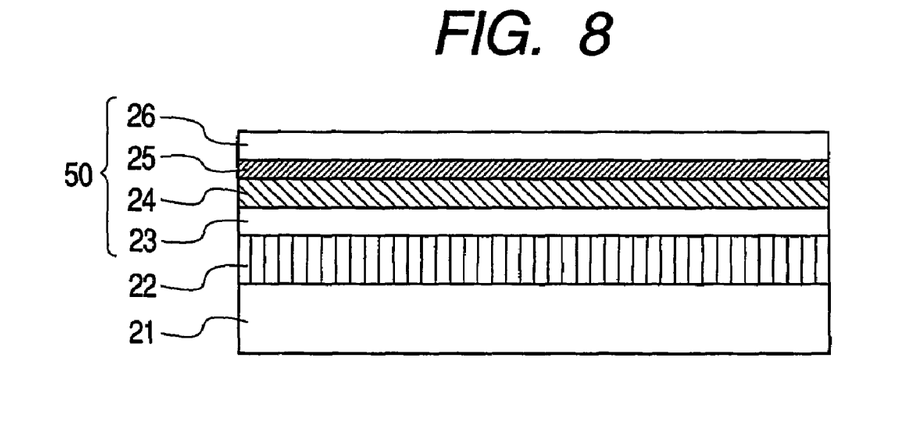
FIG. 8 is a view showing a producing method for a semiconductor device in a preferred embodiment of the present invention.

Then, as shown in FIG. 8, an n-GaAs layer 23 is epitaxially grown on the porous Ge layer 22, and then an n-AlGaAs layer 24 as an n-clad layer, a GaAs layer 25 as an active layer and an AlGaAs layer 26 as a p-clad layer are epitaxially grown in succession on the n-GaAs layer 23 to form a laser structure 50.

Then, in the same manner as shown in FIG. 4 of the example 1, the surface of the p-AlGaAs layer 26 of the laser structure 50 is superposed and bonded with a surface of a separately prepared substrate 20. Though not illustrated, an electrode is formed on the substrate 20 and can be electrically connected with the p-AlGaAs layer 26. The porous Ge layer, having an enormously large surface area, has a getter function of eliminating impurities which migrate into the device in the production process thereof for example from a manufacturing apparatus and may detrimentally affect the device performance.

Then the bonded substrate was divided into two in the same manner as shown in FIG. 5 in the example 1.

Figure 9:
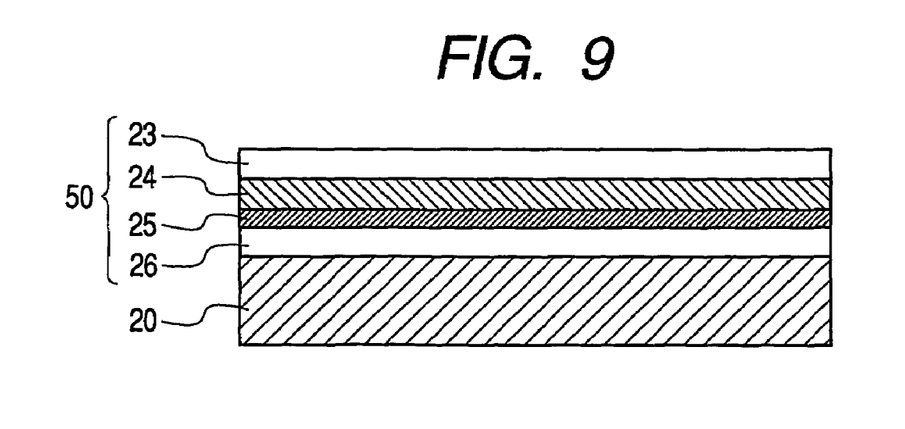
FIG. 9 is a view showing a producing method for a semiconductor device in a preferred embodiment of the present invention.

Then the porous Ge layer was eliminated in the same manner as shown in FIGS. 6 and 7 in the example 1. In this manner, the laser structure 50 (n-GaAs/n-AlGaAs/GaAs/p-AlGaAs) was transferred onto the substrate 20 as shown in FIG. 9. An electrode, though not illustrated, was formed on the n-GaAs layer 23 to enable an electrical connection.

The example 2 allows to produce a semiconductor laser of a double hetero structure.

Example 3

In an example 3, at first two porous germanium layers 102, 103 are formed by anodizing on a germanium substrate 101 as shown in FIG. 10. As the porous layer by anodizing is formed from the surface, a porous germanium layer 103 with a lower porosity is at first formed, and then a porous germanium layer 102 with a larger porosity is formed. This process allows to facilitate a next step of closing pores, present on the surface prior to epitaxial growth, and to smoothly separate the germanium substrate 101 in a later step.

Then a high-temperature hydrogen annealing and a CVD process utilizing $GeH_4$, $GeCl_4$ etc. as the raw material gas close the pores present on the surface of the porous germanium layer to form a satisfactory crystalline surface on the surface of the porous germanium, and a single crystal germanium layer 104, an n-GaAs layer 105, an n-$Al_xGa_{1-x}As$ layer 106, an n-$Al_yGa_{1-y}As$ layer 107, an n-$Al_xGa_{1-x}As$ layer 108, and an n-GaAs layer 109 (y<x) are epitaxially grown in succession, as shown in FIG. 11.

An impurity concentration and a thickness of the epitaxially grown layer depend on the designing of the device, but a typical configuration adopted in the example 3 is as follows:

single crystal germanium layer 104: 0.1-0.5 µm; no impurity doping
n-GaAs layer 105: 0.05-0.55 µm; Si doped
n-$Al_{0.35}Ga_{0.65}As$ layer 106: about 1 µm; Si doped
n-$Al_{0.13}Ga_{0.87}As$ layer 107: about 0.5 µm; Si doped
n-$Al_{0.35}Ga_{0.65}As$ layer 108: about 1 µm; Si doped
n-GaAs layer 109: 0.1-0.5 µm; Si doped.

The Si doping is so executed as to obtain a carrier concentration of $10^{17}/cm^3$.

Then, as shown in FIG. 12, a light emitting diode area of planar light-emission type is formed by a semiconductor process in such epitaxial layers. In the outline of the semiconductor process, an insulation layer (not shown) is formed over the entire surface by sputtering, and a window for Zn diffusion is formed therein by photolithography and drying etching. Then a ZnSiO film, constituting a diffusion source of Zn, is formed by sputtering, and a heat diffusion is executed to convert, in the Zn diffusing window area, the n-$Al_yGa_{1-y}As$ layer 107, the n-$Al_xGa_{1-x}As$ layer 108, and the n-GaAs layer 109 into a p-area 111. The insulation layer constituting the diffusion mask (not shown) is removed, then an insulation layer 110 is formed and a Cr/Au metal film 112 is formed as an electrode/reflective mirror.

Then, as shown in FIG. 13, a handle substrate 113 is adhered with a peelable adhesive tape (not shown) to the surface of the metal film 112, and a high pressure water flow (water jet), focused into a fine flow, is ejected to the vicinity of the porous layers 102 and 103. Since a large stress is present at the interface of the porous layers 102 and 103, under the ejection of the high pressure water flow W, the substrate can be separated at the interface of the two porous germanium layers. Such substrate separating method is excellent in reliability.

As the peelable adhesive tape, there was employed a type capable of self peeling by gas generation at the adhered interface under an ultraviolet irradiation.

The porous germanium layer 103 remaining on the surface after the separation of the germanium substrate 101 is eliminated by etching, and an etching stop can be reproducibly realized at the interface of the porous layer and the epitaxial layer, because the porous layer has a low density and shows a very high etching rate.

Thereafter the germanium layer 104 and, if necessary, the GaAs epitaxial layer 105 are partially eliminated by etching as shown in FIG. 14, and an n-side metal electrode AuGe/Au 114 is formed excluding a portion of a light emitting window.

In case of improving the directionality of the emitted light, a mold lens 115 is formed on the light emitting window as shown in FIG. 15, and such lens can be obtained with uniform characteristics since the mold lens 115 is formed on a flat plane.

Then a separation was executed into a light emitting diode array chip (or a light emitting diode chip). Since the configuration is thin, a chip separation by creeping allow to reduce an area for chip separation and significantly reduce a fluctuation in the chip size.

Finally the light emitting diode array chip (or light emitting diode chip) is self peeled from the handle substrate 113 by an ultraviolet irradiation, and is directly bonded, as shown in FIG. 16 (illustration being vertically inverted from FIG. 14), to lead wirings 117 of a same pitch of a driver IC 16 or a relay board bearing a wiring pattern (not shown). In this operation, since the chip size has a very high precision, there can be attained a high alignment accuracy and a narrow-pitch wiring difficult to achieve by wire bonding. Therefore, in case the light emitting diode array chip of the example 3 is used for example in a light emitting diode printer head, an array mounting of aligning the light emitting diode array chips in a linear array can be achieved with a high precision.

Example 4

In contrast to the example 3 in which the germanium substrate 101 is separated after the light emitting diode process, an example 4 executes the light emitting diode process after the separation of the germanium substrate 101, and each step is same as that in the example 3. In the following, an explanation will be given principally on different points.

Figure 18:
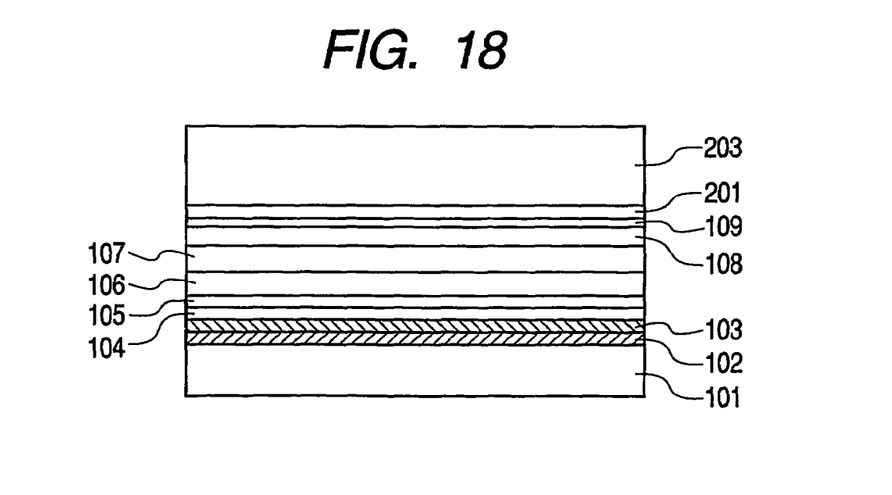
FIG. 18 is a view showing a structure of a light emitting diode in a preferred embodiment of the present invention.

At first, porous germanium layers 102, 103 are formed on a germanium substrate 1 as shown in FIG. 18, and then, on its surface, a single crystal germanium layer 104, an n-GaAs layer 105, an n-$Al_xGa_{1-x}As$ layer 106, an n-$Al_yGa_{1-y}As$ layer 107, an n-$Al_xGa_{1-x}As$ layer 108, and an n-GaAs layer 109 (y<x) are epitaxially grown in succession. The impurity concentration and the thickness of each layer are same as those in the example 3.

Then, as shown in FIG. 18, an n-side metal electrode layer 201 is formed on the uppermost surface, and a second substrate 203 is adhered thereto. In order to maintain the process resistance thereafter, the adhesion is executed by direct bonding of contacting, after surface cleaning of the metal electrode layer 201 and the second substrate 203, the two under pressure and heat.

Figure 19:
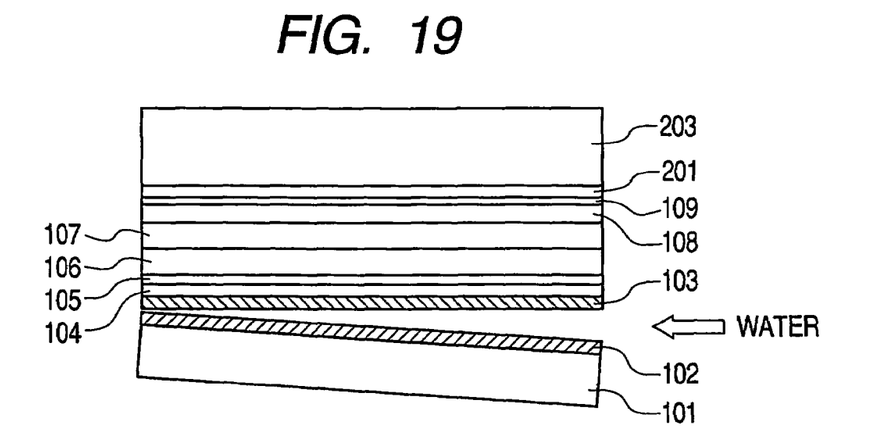
FIG. 19 is a view showing a structure of a light emitting diode in a preferred embodiment of the present invention.

Then, as shown in FIG. 19, a high pressure water flow W (water jet), focused into a fine flow, is ejected to the vicinity of the porous layers 102 and 103, thereby separating the germanium substrate 101 at the interface of the porous germanium layers 102 and 103.

Figure 20:
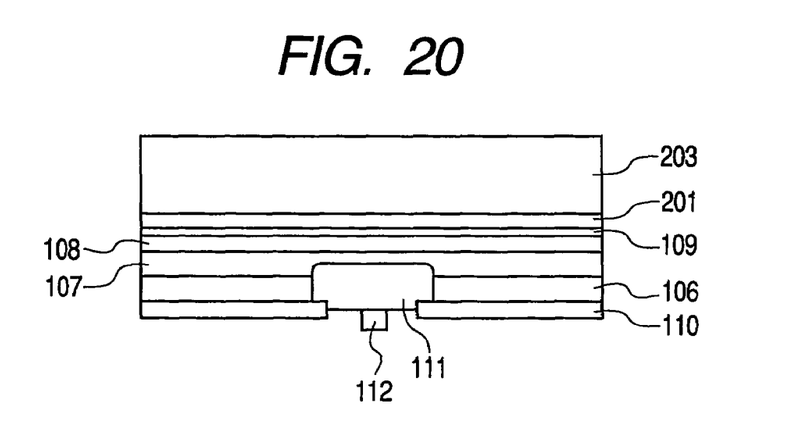
FIG. 20 is a view showing a structure of a light emitting diode in a preferred embodiment of the present invention.
Figure 21:
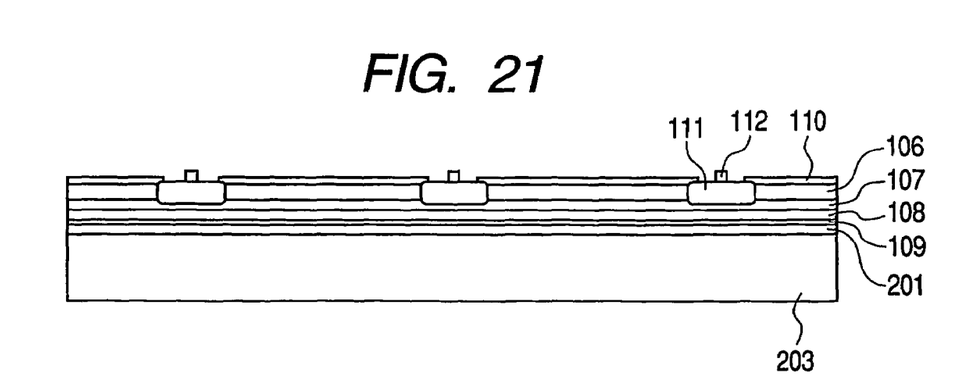
FIG. 21 is a view showing a structure of a light emitting diode in a preferred embodiment of the present invention.

Then, after the single crystal germanium layer 104 on the surface after the separation of the germanium substrate 101 is eliminated, and a light emitting diode of a planar light-emission type is formed by a semiconductor process, as shown in FIG. 20. The germanium surface after the elimination of the porous layer presents surface roughness because of the influence of the porous layer, but the GaAs surface after the etching elimination of the germanium layer has an excellent flatness, allowing a fine process. The process for forming the light emitting diode of the planar light-emission type is similar to that in the example 3, but, since a Zn-diffusion area 111 constitutes a light emitting window, the p-side metal electrode 112 is made as small as possible to reduce a shielding portion for the light of the light emitting diode. Then the structure is separated, together with the second substrate 203, by a dicing saw into a light emitting diode array chip, whereby a configuration of the light emitting diode array chip shown in FIG. 21 is completed.

Figure 22:
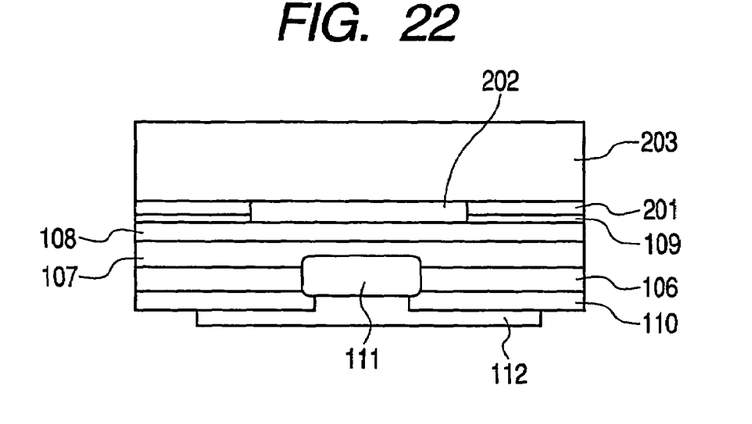
FIG. 22 is a view showing a structure of a light emitting diode in a preferred embodiment of the present invention.
Figure 23:
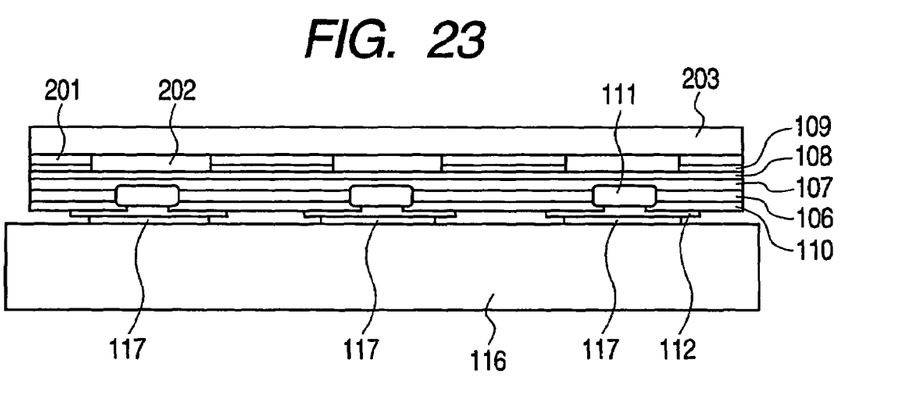
FIG. 23 is a view showing a structure of a light emitting diode in a preferred embodiment of the present invention.

Then, as shown in FIG. 22, a substrate transparent to the wavelength of the emitted light is adhered as a second substrate 203, and a light emitting window 202 is formed in the electrode layer 201 to obtain a light emitting diode array which emits light through the transparent substrate, as shown in FIG. 23. The electrode layer 201 may also be constituted of a transparent material.

It is also possible to realize the configuration of the light emitting diode array shown in FIG. 16, by separating the second substrate 203 (which need not be transparent in this case) from the configuration shown in FIG. 22.

Since the metal electrode 201 in the example 4 can provide a function of a reflective mirror, it is possible to utilize the reflected light by partially eliminating the n-GaAs layer 109. It is also possible, as in FIG. 17, to eliminate the stray light etc. that is not emitted to the exterior, by providing an absorbing layer 209 in the vicinity of the metal electrode.

In the example 4, since the porous germanium layer is absent at the light emitting diode process, there is not required a measure for providing the porous germanium layer with a process resistance, and an ordinary light emitting diode process can be directly applicable.

As explained in the foregoing, the planar light emitting diode or the planar light emitting diode array of the invention is advantageously employable in a light emitting diode printer head (to be mounted in a printer). In addition, the present invention is advantageously applicable, for example, to a display apparatus constituted by two-dimensionally arranging the planar light emitting diodes (planar light emitting diode arrays).

(Others)

In the epitaxial growing step for forming a gallium arsenide layer, there can be applied various film forming technologies such as MBE method.

In the selective etching step for the separating layer (porous layer, ion implanted layer etc.) remaining after the dividing operation, there can be employed, in addition to the aforementioned mixture of 49% hydrofluoric acid, 30% hydrogen peroxide and water, various etching solutions (for example a mixture of hydrofluoric acid, nitric acid and acetic acid).

As many apparently widely different embodiments of the present invention can be made without departing from the spirit and scope thereof, it is to be understood that the invention is not limited to the specific embodiments thereof except as defined in the claims.

The invention claimed is:

1. A method for producing a semiconductor substrate including a gallium arsenide layer, comprising:
   a step of preparing a first substrate having a separating layer comprising a first porous germanium layer of a first porosity and a second porous germanium layer of a second porosity larger than the first porosity, and a gallium arsenide layer on said separating layer;
   a step of preparing a bonded substrate by bonding said first substrate and a second substrate; and
   a step of dividing said bonded substrate at a portion of said separating layer,
   wherein a germanium layer is provided on said separating layer, and said gallium arsenide layer is formed on said germanium layer provided on said separating layer.

2. A method for producing a semiconductor substrate according to claim 1, wherein
   said preparation step for said first substrate includes a step of forming said first and second porous germanium layers as said separating layer by anodizing of a substrate constituted of germanium, and forming said gallium arsenide layer on said first and second porous germanium layers.

3. A method for producing a semiconductor substrate according to claim 2, wherein:
   said preparation step for said first substrate includes a step of forming said gallium arsenide layer by an epitaxial growth.

4. A method for producing a semiconductor substrate according to claim 1, wherein:
   said preparation step for said first substrate includes a step of forming a compound semiconductor layer on said gallium arsenide layer.

5. A method for producing a semiconductor substrate according to claim 1, wherein:
   said dividing step includes a step of dividing the portion of said separating layer by a jet stream or a static pressure of a fluid.

6. A method for producing a semiconductor substrate according to claim 1, wherein:
   said dividing step includes a step of dividing the portion of said separating layer by applying a heat treatment to said bonded substrate.

7. A method for producing a semiconductor substrate according to claim 1, wherein:
   said dividing step includes a step of dividing the portion of said separating layer by inserting a member into said separating layer.

8. A method for producing a semiconductor substrate according to claim 1, further comprising:
   after said dividing step, a step of eliminating a part of said separating layer, remaining on said gallium arsenide layer on the second substrate.

9. A method for producing a semiconductor substrate according to claim 1, further comprising:
   after said dividing step, a step of planarizing the surface of said gallium arsenide layer on the second substrate.

10. A method for producing a semiconductor substrate according to claim 1, further comprising:
    after said dividing step, a step of eliminating a part of said separating layer, remaining on the first substrate.

11. A method for producing a semiconductor substrate according to claim 1, further comprising:
    after said dividing step, a step of planarizing a surface of the first substrate and re-using the same in said preparation step of the first substrate.

12. A method for producing a semiconductor substrate according to claim 1, wherein said germanium layer provided on said separating layer is a single crystalline germanium layer.

13. A method for producing a light emitting diode, comprising:
    a step of preparing a porous germanium layer comprising a first porous germanium layer of a first porosity and a second porous germanium layer of a second porosity larger than the first porosity on a semiconductor substrate constituted of germanium;
    a step of forming plural semiconductor layers, including a gallium arsenide layer, on said porous germanium layer;
    a step of forming a light emitting diode area in said semiconductor layers;
    a step of forming a reflective layer on said light emitting diode area; and
    a step of separating said semiconductor substrate at said porous germanium layer,
    wherein a germanium layer is provided on said porous germanium layer, and said gallium arsenide layer is formed on said germanium layer provided on said porous germanium layer.

14. A method for producing a light emitting diode according to claim 13, further comprising:
    after said separating step, a step of forming an electrode.

15. A method for producing a light emitting diode according to claim 13, further comprising:
    after said separating step, a step of forming a light emitting window.

16. A method for producing a light emitting diode according to claim 13, wherein said plural semiconductor layers including the gallium arsenide layer are constituted of AlGaAs semiconductors of different Al compositions.

17. A method for producing a light emitting diode according to claim 13, wherein said reflective layer is constituted of a metal layer, which partly serves also as a metal electrode.

18. A method for producing a light emitting diode according to claim 13, wherein an insulation layer is provided between said reflective layer and the semiconductor layers, and an absorbing layer for partially reducing light reflection is provided between said insulation layer and the semiconductor layers.

19. A method for producing a light emitting diode according to claim 13, wherein an electrode at a light emitting side of said light emitting diode is so formed as to surround a light emitting window, and a light absorbing layer is formed on a surface of said electrode in contact with the semiconductor layers.

20. A method for producing a light emitting diode, comprising:

- a step of preparing a porous germanium layer comprising a first porous germanium layer of a first porosity and a second porous germanium layer of a second porosity larger than the first porosity on a semiconductor substrate constituted of germanium;
- a step of forming plural semiconductor layers, including a gallium arsenide layer, on said porous germanium layer;
- a step of forming a metal electrode layer in an uppermost layer of said plural semiconductor layers;
- a step of adhering a supporting substrate to a surface of said metal layer;
- a step of separating said semiconductor substrate at said porous germanium layer; and
- a step of forming a light emitting diode area in said semiconductor layers after the separation,
- wherein a germanium layer is provided on said porous germanium layer, and said gallium arsenide layer is formed on said germanium layer provided on said porous germanium layer.

21. A method for producing a light emitting diode according to claim 20, wherein said plural semiconductor layers including the gallium arsenide layer are constituted of AlGaAs semiconductors of different Al compositions.

22. A method for producing a light emitting diode according to claim 20, wherein said metal electrode layer has a function of a reflective mirror.

23. A method for producing a light emitting diode according to claim 20, wherein said supporting substrate is transparent to the emitted light, and said metal electrode layer is partially eliminated corresponding to a light emitting area.

24. A method for producing a light emitting diode according to claim 20, wherein an absorbing layer for partially reducing a light reflection is provided between said metal electrode layer and the semiconductor layers.

25. A method for producing a light emitting diode according to claim 13 or 20, wherein said germanium layer provided on said porous germanium layer is a single crystalline germanium layer.

* * * * *